United States Patent
Murayama et al.

(10) Patent No.: US 8,664,972 B2
(45) Date of Patent: Mar. 4, 2014

(54) MEMORY CONTROL CIRCUIT, MEMORY CONTROL METHOD, AND INTEGRATED CIRCUIT

(75) Inventors: Kohei Murayama, Kawasaki (JP); Takeshi Suzuki, Tachikawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/294,107

(22) Filed: Nov. 10, 2011

(65) Prior Publication Data

US 2012/0060003 A1    Mar. 8, 2012

Related U.S. Application Data

(63) Continuation of application No. 12/441,139, filed as application No. PCT/JP2007/070070 on Oct. 15, 2007, now Pat. No. 8,076,954.

(30) Foreign Application Priority Data

Oct. 18, 2006   (JP) ................ 2006-284142

(51) Int. Cl.
  *H03K 17/16*   (2006.01)
(52) U.S. Cl.
  USPC ............... 326/30; 326/28; 326/32; 326/83; 326/87; 365/189.05; 365/189.09; 365/191; 365/198
(58) Field of Classification Search
  USPC ............ 326/28, 30, 32, 83, 87; 365/191, 198
  See application file for complete search history.

(56) References Cited

U.S. PATENT DOCUMENTS

| 6,347,367 | B1 | 2/2002 | Dell et al. |
| 6,762,620 | B2 | 7/2004 | Jang et al. |
| 6,828,819 | B2 | 12/2004 | Park et al. |
| 6,977,832 | B2 * | 12/2005 | Isa et al. ................ 365/51 |
| 7,130,228 | B2 | 10/2006 | Janzen |
| 7,138,823 | B2 | 11/2006 | Janzen et al. |
| 7,180,327 | B2 | 2/2007 | So et al. |
| 7,259,585 | B2 * | 8/2007 | Brinkman et al. ............. 326/30 |
| 7,289,383 | B2 * | 10/2007 | Cornelius .................. 365/226 |
| 7,372,293 | B2 | 5/2008 | Cox et al. |
| 7,414,426 | B2 * | 8/2008 | Cox et al. ................ 326/30 |

(Continued)

FOREIGN PATENT DOCUMENTS

| CN | 1809824 A | 7/2006 |
| JP | 2002268941 A | 9/2002 |

(Continued)

OTHER PUBLICATIONS

European Search Report issued on Jun. 21, 2012 concerning EP Application No. 12002246.2.

(Continued)

*Primary Examiner* — Linh Nguyen
(74) *Attorney, Agent, or Firm* — Fitzpatrick, Cella, Harper & Scinto

(57) ABSTRACT

Each of a plurality of memories includes a terminating resistor for preventing signal reflection, and a memory control circuit includes an ODT control circuit for driving the terminating resistor of each memory, and a selector for selecting, from memories except for a memory to be accessed, at least one memory for which driving of the terminating resistor is to be suppressed, in accordance with the memory to be accessed.

18 Claims, 7 Drawing Sheets

(56) References Cited

U.S. PATENT DOCUMENTS

| | | | |
|---|---|---|---|
| 7,449,914 B2 * | 11/2008 | Kim et al. | 326/30 |
| 7,516,281 B2 | 4/2009 | LaBerge | |
| 7,532,523 B2 | 5/2009 | Braun et al. | |
| 7,554,353 B2 * | 6/2009 | Lee et al. | 326/30 |
| 7,560,956 B2 * | 7/2009 | Waldrop | 326/93 |
| 7,602,209 B2 | 10/2009 | Oh et al. | |
| 7,786,752 B2 * | 8/2010 | Oh et al. | 326/30 |
| 7,843,213 B1 * | 11/2010 | Linder et al. | 326/30 |
| 2002/0125499 A1 | 9/2002 | Matsuzaki et al. | |
| 2003/0039151 A1 | 2/2003 | Matsui | |
| 2004/0098528 A1 | 5/2004 | Janzen | |
| 2004/0228196 A1 | 11/2004 | Kwak et al. | |
| 2005/0212551 A1 | 9/2005 | So et al. | |
| 2005/0289287 A1 * | 12/2005 | Shin et al. | 711/1 |
| 2005/0289304 A1 | 12/2005 | Yeh | |
| 2006/0039204 A1 * | 2/2006 | Cornelius | 365/189.05 |
| 2007/0126465 A1 * | 6/2007 | Cox et al. | 326/30 |
| 2008/0056017 A1 | 3/2008 | Suzuki et al. | |
| 2009/0066363 A1 * | 3/2009 | Kim et al. | 326/30 |
| 2009/0138665 A1 | 5/2009 | Suzuki | |
| 2011/0316580 A1 * | 12/2011 | McCall et al. | 326/30 |

FOREIGN PATENT DOCUMENTS

| | | |
|---|---|---|
| JP | 2003-068082 A | 3/2003 |
| JP | 2003197753 A | 7/2003 |
| JP | 2003345735 A | 12/2003 |
| JP | 2005285125 A | 10/2005 |
| JP | 2006-516059 A | 6/2006 |
| JP | 2007233589 A | 9/2007 |
| JP | 2007241799 A | 9/2007 |

OTHER PUBLICATIONS

Japanese Office Action issued on Jan. 16, 2012, concerning Japanese Patent Application No. 2006-284142.

PCT International Search Report in corresponding International Application No. PCT/JP2007/070070, dated Dec. 18, 2007.

European Search Report in corresponding European Patent Application No. 07829804.9, Jun. 8, 2012.

* cited by examiner

FIG. 5

| | CS0 | CS1 | CS2 | CS3 | OWN |
|---|---|---|---|---|---|
| ODT WRITE CONTROL REGISTER CS0 | CS0 | CS1 | CS2 | CS3 | OWN |
| ODT WRITE CONTROL REGISTER CS1 | CS0 | CS1 | CS2 | CS3 | OWN |
| ODT WRITE CONTROL REGISTER CS2 | CS0 | CS1 | CS2 | CS3 | OWN |
| ODT WRITE CONTROL REGISTER CS3 | CS0 | CS1 | CS2 | CS3 | OWN |
| ODT READ CONTROL REGISTER CS0 | CS0 | CS1 | CS2 | CS3 | OWN |
| ODT READ CONTROL REGISTER CS1 | CS0 | CS1 | CS2 | CS3 | OWN |
| ODT READ CONTROL REGISTER CS2 | CS0 | CS1 | CS2 | CS3 | OWN |
| ODT READ CONTROL REGISTER CS3 | CS0 | CS1 | CS2 | CS3 | OWN |

↑ 500

| CS0 | CS1 | CS2 | CS3 | LSI |
|---|---|---|---|---|
| 0 | 1 | 0 | 0 | 0 |
| 0 | 0 | 1 | 1 | 0 |
| 1 | 1 | 0 | 1 | 0 |
| 0 | 0 | 0 | 0 | 0 |
| 0 | 1 | 0 | 0 | 1 |
| 1 | 0 | 1 | 1 | 1 |
| 1 | 0 | 0 | 0 | 1 |
| 0 | 1 | 0 | 0 | 1 |

↑ 501

F I G. 7
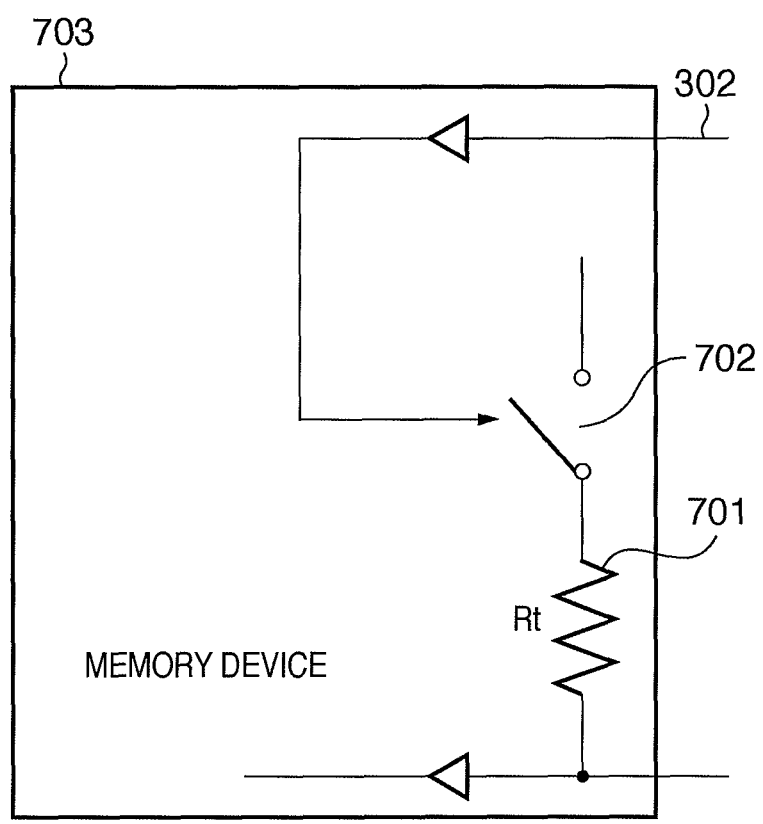

US 8,664,972 B2

MEMORY CONTROL CIRCUIT, MEMORY CONTROL METHOD, AND INTEGRATED CIRCUIT

This application is a continuation of U.S. application Ser. No. 12/441,139, filed Mar. 12, 2009 (allowed), the contents of which are incorporated herein by reference.

TECHNICAL FIELD

The present invention relates to a memory control apparatus, a memory control method, and an integrated circuit for controlling a memory having a terminating means for preventing signal reflection.

BACKGROUND ART

In a system including a semiconductor memory, devices or memory modules of the semiconductor memory are arranged on a printed circuit board, and commands and data are exchanged by transmitting electrical signals. In a transmission path in which the electrical signals are transmitted, the impedance changes at, for example, connection points of a data bus and the memory devices. As a consequence, signal reflection generates electrical noise, and this deteriorates the signal quality.

Recently, the internal operating frequencies of processors and LSIs have rapidly increased, and the data transfer rate between memory devices have been increased accordingly. However, the afore-mentioned signal quality deterioration caused by the electrical noise is a large factor that interferes with high-speed data transfer between a memory device and IC chip. To cope with this electrical noise, the influence of signal reflection is reduced by attaching a terminating resistor to the end of a transmission path on a printed circuit board in, for example, a DDR-SDRAM.

When a plurality of memory devices are mounted in the same transmission path, however, an electrical signal to a memory device to be accessed suffers from the influence of signal reflection from memory devices that are not to be accessed. Accordingly, the aforesaid terminating resistor at the end of the transition path cannot singly reduce the influence of signal reflection, and this makes high-speed data transfer difficult. Therefore, more accurate reflected signal processing is necessary to achieve faster data transfer.

To perform this more accurate reflected signal processing, on-die termination (to be referred to as ODT hereinafter) is implemented in, for example, a DDR2-SDRAM. In this DDR2-SDRAM, a memory device contains a terminating resistor, and the terminating resistor of each memory device can be turned on and off by an ODT control signal.

FIG. 7 depicts a view describing the arrangement of ODT in the DDR2-SDRAM.

In a memory device 703, a terminating resistor Rt 701 for a data signal and data strobe signal is mounted on a die. The terminating resistor Rt 701 is turned on and off by turning on and off a switch 702 by an external ODT control signal 302.

FIG. 4 depicts a view describing the relationship between data in a data bus and the ODT control signal.

When the ODT control signal (ODT) 302 is turned on (to High level), the switch 702 is turned on at a timing 402 after the elapse of tAOND from a timing 401 at which ON of the ODT control signal 302 is detected on the leading (rising) edge of memory clock CLK. Consequently, the terminating resistor Rt 701 is connected, and termination by the resistor is made effective (turned on) (403).

Then, the switch 702 is turned off at a timing 405 after the elapse of tAOFD from a timing 404 of the rising edge of CLK at which OFF of the ODT control signal is detected. As a consequence, the terminating resistor Rt 701 is opened, and the termination is set OFF. In the presently commercially available DDR2-SDRAM, the time tAOND is normally equal to two cycles of a memory clock, and tAOFD is normally equal to 2.5 cycles of the memory clock.

When the DDR2-SDRAM as described above is used, the influence of signal reflection can be reduced even if a plurality of memory devices is mounted in the same transmission path. That is, the influence of signal reflection on a memory device to be accessed can be suppressed, by turning on (connecting) the terminating resistor of a memory device that is not to be accessed. This makes faster data transfer possible.

Patent reference 1 discusses techniques pertaining to ODT of a memory device and the improvement of signal integrity obtained by ODT.

Patent reference 1: Japanese Patent Laid-Open No. 2003-345735

DISCLOSURE OF INVENTION

Problem that the Invention is to Solve

A memory adopting the DDR2-SDRAM has the advantage that the signal quality can be improved by turning on ODT, but has the disadvantage that the memory device power consumption increases if ODT is turned on in many memory devices.

It is an object of the present invention to provide a memory system which has high signal quality and is capable of reducing power consumption.

The present invention is characterized by providing a memory control apparatus and memory control method capable of accurately controlling a terminating circuit formed in a memory to prevent signal reflection.

Means for Solving the Problem

To achieve the above object, a memory control apparatus according to an aspect of the present invention has the following arrangement. That is, a memory control apparatus which controls a plurality of memories including terminating means for preventing signal reflection, and
driving means for driving the terminating means, and
selecting means for selecting, from memories except for a memory to be accessed, at least one memory for which driving of the terminating means is to be suppressed, in accordance with the memory to be accessed.

To achieve the above object, a memory control apparatus according to an aspect of the present invention has the following arrangement. That is, a memory control apparatus which controls a memory including terminating means for preventing signal reflection comprises
driving means for driving the terminating means, and
selecting means for selecting whether to drive the terminating means of the memory, in accordance with whether access to the memory is read access or write access.

To achieve the above object, a memory control method according to an aspect of the present invention has the following arrangement. That is, a memory control method of controlling a plurality of memories including a terminating circuit for preventing signal reflection comprising the steps of:

selecting, from memories except for a memory to be accessed, at least one memory for which driving of the terminating circuit is to be suppressed, in accordance with the memory to be accessed, and driving the terminating circuits of memories except for the selected memory.

To achieve the above object, a memory control method according to an aspect of the present invention has the following arrangement. That is, a memory control method which controls a memory including a terminating circuit for preventing signal reflection, comprising the steps of:

selecting whether to drive the terminating circuit of the memory, in accordance with whether access to the memory is read access or write access; and driving the terminating circuit of the memory selected to be driven.

Effect of the Invention

According to the present invention, it is possible to accurately control a terminating circuit formed in a memory to prevent signal reflection.

Other features and advantages of the present invention will be apparent from the following explanation taken in conjunction with the accompanying drawings. Note that in the accompanying drawings, the same reference numerals denote the same or similar parts.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 5 depicts a view illustrating the arrangement of ODT control registers and examples of the set values of the control registers according to the embodiment;

FIG. 7 depicts a view describing the arrangement of ODT in a DDR2-SDRAM.

BEST MODE FOR CARRYING OUT THE INVENTION

Embodiment of the present invention will be explained in detail below with reference to the accompanying drawings. Note that the following embodiment does not limit the present invention according to the scope of claims, and that not all combinations of features explained in this embodiment are essential to the solving means of the present invention.

Figure 2:
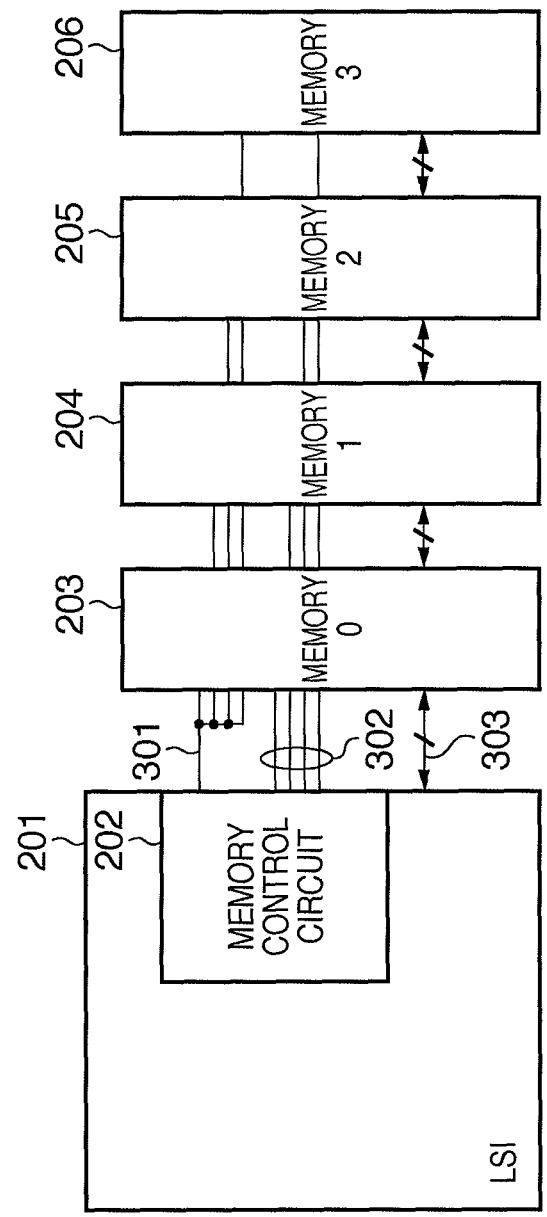
FIG. 2 depicts a conceptual view illustrating the connections between memory devices and an LSI on which the memory control circuit is mounted in the embodiment.

FIG. 2 depicts a conceptual view illustrating the connections between memory devices and an LSI on which a memory control circuit is mounted in this embodiment.

This system has a memory control circuit 202 mounted on an LSI 201, and memory devices 0 to 3 (203 to 206). Assume that the maximum number of memory devices connectable to the LSI 201 is four. The memory control circuit 202 and memory devices 203 to 206 are connected by command signals 301 for transmitting, for example, an address, command, and chip select signal, ODT control signals 302, and a data bus 303 for transferring data and data strobe.

Figure 3:
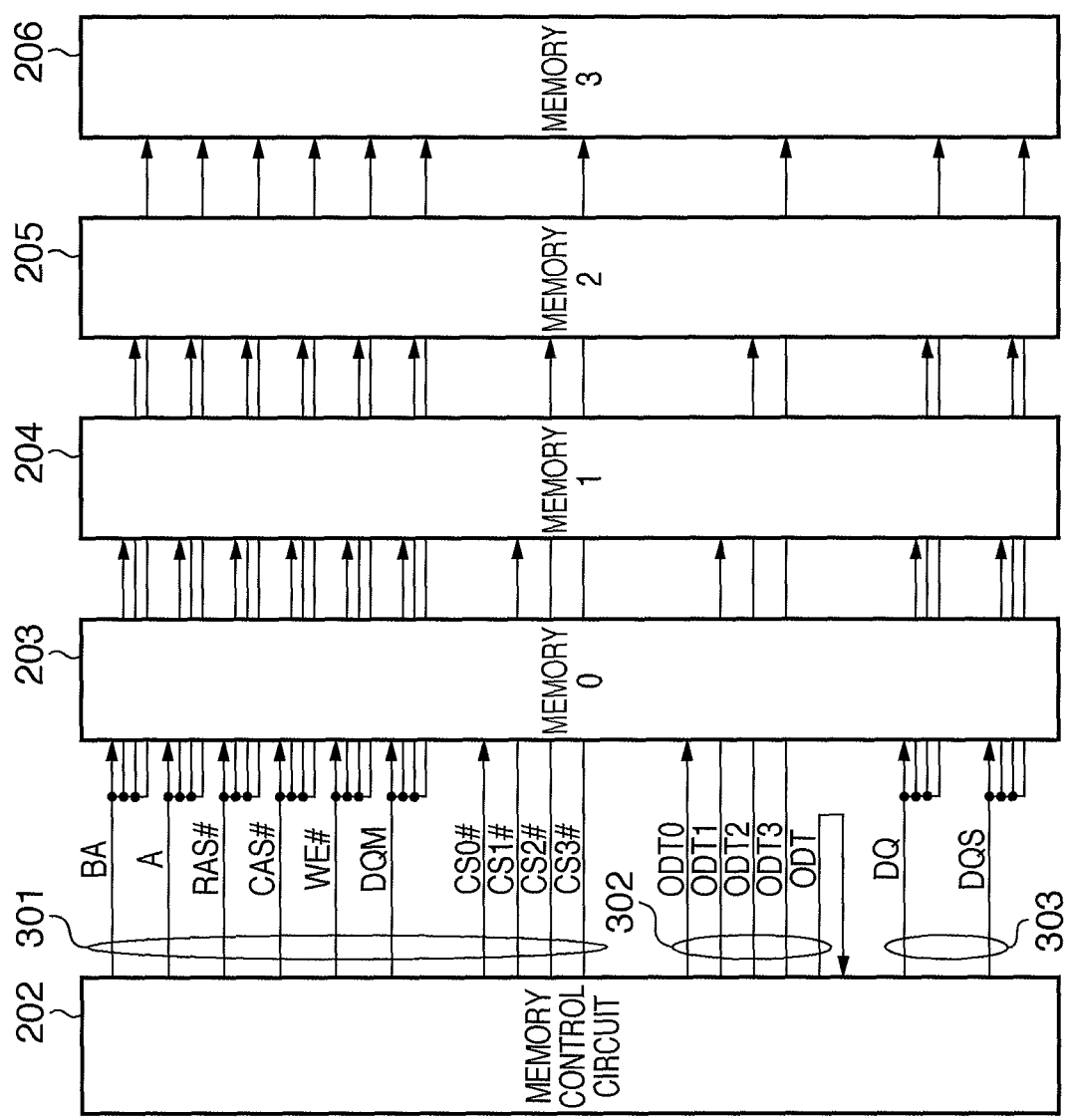
FIG. 3 depicts a view describing the signal connections between the memory control circuit according to the embodiment and the memory devices.

FIG. 3 depicts a view describing the signal connections between the memory control circuit 202 and memory devices 203 to 206 in this embodiment.

Signals of bank address BA, address A, row address strobe RAS#, column address strobe CAS#, write enable WE#, and data mask DQM included in the signals 301 are commonly distributed to the memory devices 203 to 206.

On the other hand, chip select signals CS0, CS1, CS2, and CS3 for selecting the memory devices and the ODT control signals 302 (ODT0, ODT1, ODT2, and ODT3) for controlling ODT of the memory devices are independently connected to the memory devices 203 to 206. Note that # indicates a negative logic (Low true) signal. The ODT control signals 302 also include a control signal (ODT) for the LSI 201 itself on which the memory control circuit 202 is mounted, in addition to the ODT control signals for the memory devices 203 to 206.

Figure 4:
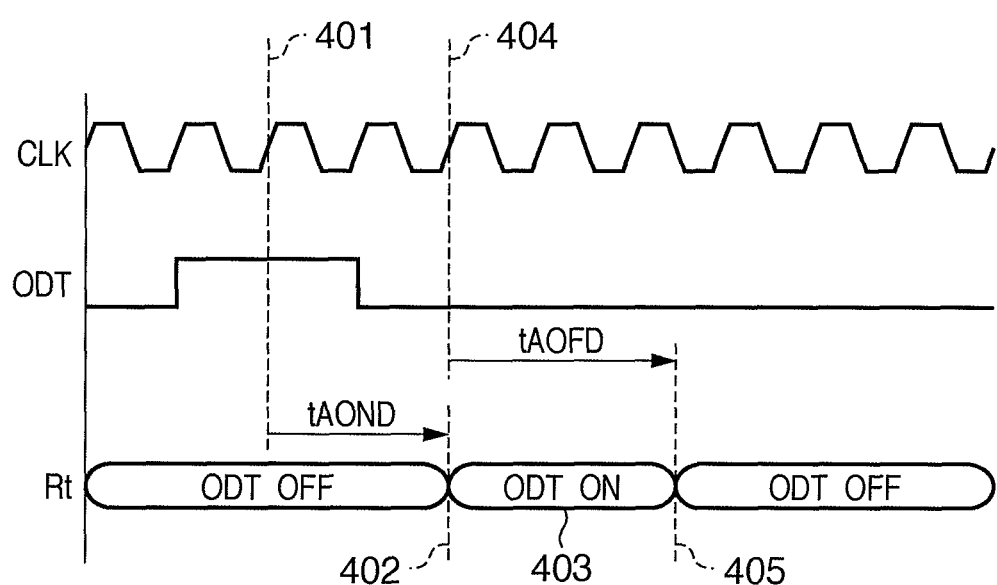
FIG. 4 depicts a view describing the relationship between data in a data bus and an ODT control signal.

Note that in this embodiment, as shown in FIG. 4, the timing at which the ODT control signal (ODT) is output to the LSI 201 itself is the same as the control timing of the memory device. Even when the control timings of the memory device and LSI are different, however, these timings can be independently controlled. All these signals are unidirectional signals transmitted from the memory control circuit 202 to the memory devices 203 to 206.

In addition, the data bus 303 exists for bidirectional signals between the memory control circuit 202 and memory devices 203 to 206, and includes a data signal DQ and data strobe signal DQS.

The memory control circuit 202 can transfer data to and from the memory devices 203 to 206 by controlling these signals.

ODT control in the memory control circuit 202 according to this embodiment will be explained below with reference to FIG. 1.

Figure 1:
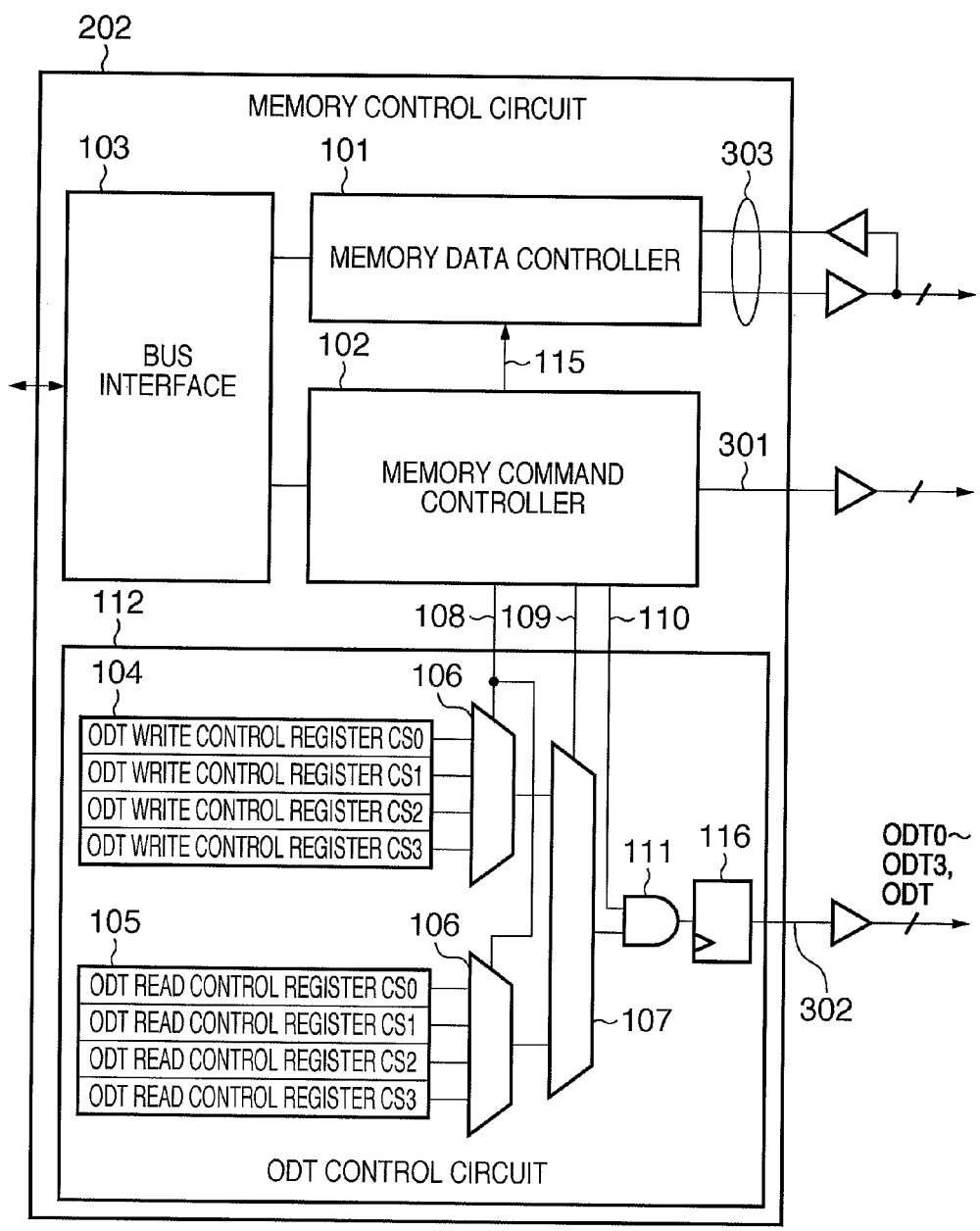
FIG. 1 is a block diagram describing the arrangement of a memory control circuit according to an embodiment.

FIG. 1 is a block diagram describing the arrangement of the memory control circuit 202 according to this embodiment.

The memory control circuit 202 according to this embodiment has a memory data controller 101, memory command controller 102, bus interface 103, and ODT control circuit 112.

When receiving a memory access request from a bus master such as a CPU (not shown), the bus interface 103 transfers an address to be accessed, the type of read/write, and the like to the memory command controller 102. The bus interface 103 also exchanges data to be written in a memory device and data read out from a memory device with the memory data controller 101. The memory data controller 101 exchanges data with the bus interface 103, and also exchanges data with a memory device based on a timing signal 115 from the memory command controller 102.

The memory command controller 102 forms an access command to a memory device based on the address and the type of read/write contained in the memory access request received from the bus interface 103. Also, the memory command controller 102 controls the signals 301 by controlling the timings on the memory bus side.

Furthermore, in response to a self-issued memory command, the memory command controller 102 calculates the timing at which data is driven on the data bus 303. In accordance with this timing, the memory command controller 102 asserts an ODT enable signal 110 for designating driving of the ODT control signal 302. The ODT enable signal 110 is controlled such that the ODT control signal 302 asserted to the memory devices 203 to 206 is valid while data is output on the data bus 303. That is, when outputting data to the data bus 303, the ODT enable signal 110 is controlled so as to turn on the ODT control signal (to High level) at the time tAOND (FIG. 4) before the data is effective. When terminating the data output to the data bus 303, the ODT enable signal 110 is controlled so as to turn off the ODT control signal at the time tAOFD before the timing at which the data on the data bus is not effective.

In this manner, as will be described later, the ODT control signal 302 generated by the ODT control circuit 112 is output after being delayed by a maximum of one clock cycle from the output of the ODT enable signal 110 via a flip-flop 116. Accordingly, the ODT enable signal 110 asserted from the memory command controller 102 is controlled to change to High level before data driving of the data bus 303 by a cycle obtained by adding a maximum of one cycle to each of tAOND and tAOFD. The memory command controller 102 asserts an ODT direction signal 109 and ODT device signal 108 at the same time the ODT enable signal 110 is asserted. The ODT direction signal 109 indicates the type of read/write of data to be driven to the data bus 303, and the ODT device signal 108 indicates a memory device as a target of the data to be driven to the data bus 303.

The ODT device signal 108, ODT direction signal 109, and ODT enable signal 110 are transferred to the ODT control circuit 112, thereby determining the ODT control signal 302 to be output inside the ODT control circuit 112. Note that in this embodiment, the ODT direction signal 109 is set at Low level in data read and High level in data write.

The arrangement and operation of the ODT control circuit 112 will now be explained.

The ODT control circuit 112 includes ODT control registers 104 and 105, and a logic circuit for generating the ODT control signal 302 for each memory device. The ODT control register 104 stores data for controlling ODT when writing data in a memory device. The ODT control register 105 stores data for controlling ODT when reading out data from a memory device.

FIG. 5 depicts a view illustrating the arrangement of the ODT control registers 104 and 105 and examples of their set values. Note that the ODT control registers 104 and 105 are independently formed for each memory device and read/write.

In this embodiment, a maximum of four memory devices can be connected. Therefore, read registers and write registers are formed for the four registers, so eight ODT control registers are formed in total.

As indicated by numeral 500 in FIG. 5, each ODT control register is classified into five fields corresponding to the four memory devices 203 to 206 connected to the register and the LSI 201 itself. In accordance with a chip select signal asserted for a memory device and the type of read/write, an ODT control signal to be turned on is designated. In this embodiment, if "1" is set in this field (see 501 in FIG. 5), an ODT control signal for a memory device corresponding to the field is turned on.

Reference numeral 501 in FIG. 5 denotes a view showing practical examples of the set values of the ODT control registers 104 and 105. Note that these values are set in accordance with the characteristics of the system including the LSI 201 and memory devices. That is, when identical LSIs are mounted on a plurality of types printed circuit boards or systems, the operating frequencies and transmission path characteristics are different. However, the ODT control registers 104 and 150 are set to be able to obtain signal quality with which each system can operate, in accordance with the operating frequency and transmission path characteristics.

An ODT control register to be actually used in memory access is selected from the eight ODT control registers based on the ODT device signal 108 and ODT direction signal 109 asserted from the memory command controller 102. In this embodiment, a selector 106 selects a memory device, and a selector 107 selects the type of read/write, thereby determining an ODT control register to be used. However, the present invention is not limited to this configuration.

An AND circuit 111 performs AND operation of the value of the ODT control register thus selected and the ODT enable signal 110, and outputs the logical product as the ODT control signal 302 for the memory devices 203 to 206 and the LSI 201 itself.

When issuing a data write request (write access) for memory device 0 (203) with the values being set as indicated by 501 in FIG. 5, control is performed to turn on only an ODT control signal corresponding to memory device 1 (204).

When issuing read access to memory device 1 (204), control is performed to turn on ODT control signals (OWN) for memory device 0. (CS0), memory device 2 (CS2), memory device 3 (CS3), and the LSI 201 itself. That is, the ODT control signals of all the memory devices except the memory device 1 (204) are turned on.

Also, when writing data in memory device 3 (206), control is performed to turn off all the ODT control signals because "0" is set in all the fields.

Figure 6:
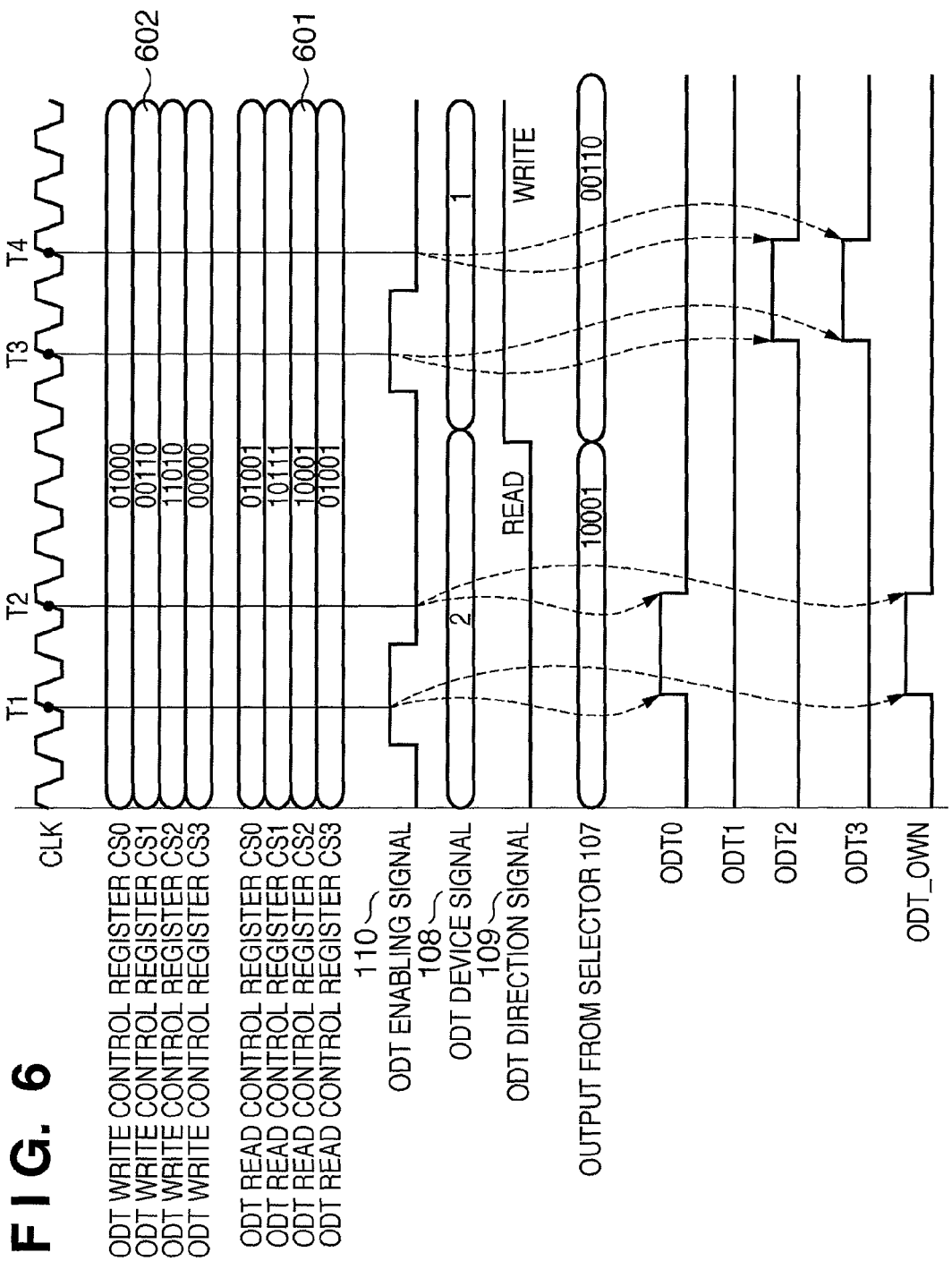
FIG. 6 depicts a view illustrating the relationships between signals related to an ODT control circuit and ODT control signals when write access to memory device 1 is asserted following read access to memory device 2 while the values shown in FIG. 5 are set.

FIG. 6 depicts a view describing the relationships between signals related to the ODT control circuit 112 and the ODT control signals when a write access to memory device 1 (204) is issued following a read access to memory device 2 (205) while the values indicated by 501 in FIG. 5 are set.

Referring to FIG. 6, when performing read access to memory device 2 (205), the contents (10001) of an ODT read control register (CS2) indicated by 601 are selected and output from the selector 107. The flip-flop 116 outputs ODT control signals at a timing T1 of the rising edge of the first clock (CLK) since the ODT enable signal 110 has changed to High level. Of these ODT control signals, only ODT0 and ODT_OWN respectively corresponding to CS0 and OWN are at High level. At a timing T2 of the rising edge of the first clock (CLK) since the ODT enable signal 110 has changed to Low level, the latch data of the flip-flop 116 is reset to "0", and the ODT control signals are reset to Low level.

When performing write access to memory device 1 (204), the contents (00110) of an ODT read control register (CS1) indicated by 602 are selected and output from the selector 107. The flip-flop 116 outputs ODT control signals at a timing T3 of the rising edge of the first clock (CLK) since the ODT enable signal 110 has changed to High level. Of these ODT control signals, only ODT2 and ODT3 respectively corresponding to CS2 and CS3 become High level. At a timing T4 of the rising edge of the first clock (CLK) since the ODT enable signal 110 has changed to Low level, the latched data of the flip-flop 116 is reset to "0", and the ODT control signals are reset to Low level.

Note that in this embodiment, designation for setting (effective) the ODT control signal 302 for a memory device at High level is determined in accordance with the set values of the programmable registers 104 and 105 of the memory control circuit 202.

The present invention is not limited to this, however, and a memory device for which the ODT control signal 302 is to be set at High level (effective) may also be set from an external terminal of the LSI 201.

As has been explained above, this embodiment can perform ODT control by programmably determining a memory device for which the ODT control signal 302 is effective, with respect to a memory device to be accessed. Therefore, accurate memory device ODT control can be performed even when the memory access control or memory operating speed of a certain LSI is changed, or even when the configuration of a system or circuit board including the LSI is changed.

It is also possible to reduce the power consumption of ODT because asserting of an unnecessary ODT control signal can be suppressed without affecting data transfer to and from memory devices.

The present invention is not limited to the above embodiment and various changes and modifications can be made without departing from the spirit and scope of the invention. Therefore, to apprise the public of the scope of the present invention, the following claims are appended.

This application claims the benefit of Japanese Patent Application No. 2006-284142, filed Oct. 18, 2006, which is hereby incorporated by reference herein in its entirety.

The invention claimed is:

1. A memory control apparatus for controlling a plurality of memories, each of which includes a respective terminating circuit for preventing signal reflection in the corresponding memory, the memory control apparatus comprising:
   a memory command controller configured to assert an On-Die Termination (ODT) enable signal for enabling ODT signals;
   a memory data controller configured to control a data transmission between a bus interface and one of the plurality of memories; and
   an ODT controller configured to assert an ODT signal to each of the plurality of memories via a delay circuit based on the ODT enable signal asserted by the memory command controller,
   wherein the memory command controller asserts the ODT enable signal in advance to compensate for a delay of the delay circuit.

2. The memory control apparatus according to claim 1, wherein the memory command controller asserts the ODT enable signal in advance to compensate for the delay of the delay circuit and ODT turn on delay time (tAOND).

3. The memory control apparatus according to claim 1, wherein the memory command controller asserts the ODT enable signal in advance to compensate for the delay of the delay circuit and ODT turn off delay time (tAOFD).

4. The memory control apparatus according to claim 1, further comprising:
   a driving unit constructed to respectively drive each of the terminating circuits to enable the respective terminating circuit to prevent signal reflection in each memory;
   a register constructed to store information indicating a terminating circuit to be driven by the driving unit in accordance with a memory to be accessed; and
   a selecting unit constructed to select, from the plurality of memories except for the memory to be accessed, at least one memory for which the terminating circuit is to be driven by the driving unit, based on the information stored in the register.

5. The memory control apparatus according to claim 1, wherein a terminating circuit of a first memory of the plurality of memories is driven when accessing a second memory, and is not driven when accessing a third memory.

6. The memory control apparatus according to claim 4, wherein the selecting unit includes a setting unit constructed to set whether to drive the terminating circuit of each of the plurality of memories, in accordance with the memory to be accessed.

7. The memory control apparatus according to claim 1, further comprising:
   a driving unit constructed to drive a terminating circuit to enable the terminating circuit to reduce signal reflection in a memory;
   a register constructed to store information indicating whether the terminating circuit is to be driven in accordance with whether an access to the memory is a read access or a write access; and
   a selecting unit constructed to select whether to drive the terminating circuit of the memory based on the information stored in the register.

8. The memory control apparatus according to claim 4, wherein when accessing one of the plurality of memories, the selecting unit selects whether to drive a respective terminating circuit of each of the plurality of memories, in accordance with the memory to be accessed and whether the access is the read access or the write access.

9. The memory control apparatus according to claim 4, wherein the memory command controller asserts an ODT direction signal and an ODT device signal, wherein the delay circuit includes a flip flop.

10. A memory control method for controlling a plurality of memories, each of which includes a respective terminating circuit for preventing signal reflection in the corresponding memory, the method comprising:
   asserting an On-Die Termination (ODT) enable signal for enabling ODT signals in advance for compensating for a delay of a delay circuit;
   controlling data transmission between a bus interface and one of the plurality of memories; and
   asserting an ODT signal to each of the plurality of memories via the delay circuit based on the ODT enable signal.

11. The memory control method according to claim 10, further comprising:
   storing information in a register indicating a terminating circuit to be driven in accordance with a memory to be accessed;
   selecting, from among the memories except for the memory to be accessed, at least one memory for which the terminating circuit is to be driven based on the information stored in the register; and
   driving the respective terminating circuit of the selected ones of the at least one memory for which the terminating circuit is to be driven, to enable the respective terminating circuit to reduce signal reflection.

12. The memory control method according to claim 10, wherein a terminating circuit of a first memory of the plurality of memories is driven when accessing a second memory, and is not driven when accessing a third memory.

13. A memory control method according to claim 10, further comprising:

storing information in a register indicating whether a terminating circuit is to be driven in accordance with whether an access to a memory is a read access or a write access;

selecting whether to drive the terminating circuit of the memory, based on the information stored in the register; and driving the terminating circuit of the memory selected in the selecting step, to enable the terminating circuit to reduce signal reflection.

14. The memory control method according to claim 10, wherein when accessing to one of the plurality of memories, the selecting step selects whether to drive a respective terminating circuit of each of the plurality of memories in accordance with whether the access is one of the read access or the write access.

15. A memory system comprising:
a bus interface;
a plurality of memories, each including a respective terminating circuit for preventing signal reflection;
a memory command controller configured to assert an On-Die Termination (ODT) enable signal for enabling ODT signals;
a memory data controller configured to control a data transmission between a bus interface and one of the plurality of memories; and
an ODT controller configured to assert an ODT signal to each of the plurality of memories via a delay circuit based on the ODT enable signal,
wherein the memory command controller asserts the ODT enable signal in advance to compensate for a delay of the delay circuit based on the ODT enable signal asserted by the memory command controller.

16. A memory control apparatus for controlling a plurality of memories, each of which includes a respective terminating circuit for preventing signal reflection in the corresponding memory, the memory control apparatus comprising:
a memory command controller configured to decode a memory access request and to assert an On-Die Termination (ODT) enable signal for enabling ODT signals based on the memory access request;
a memory data controller configured to control a data transmission between a bus interface and at least one of the plurality of memories; and
an ODT controller configured to assert an ODT signal to at least one of the plurality of memories via a latch unit based on the ODT enable signal asserted by the memory command controller,
wherein the memory command controller asserts the ODT enable signal in advance to compensate for a delay due to the latch unit for preventing signal reflection caused by the plurality of memories.

17. The memory control apparatus according to claim 1, wherein the memory command controller asserts the ODT enable signal by the delay of the delay circuit in advance.

18. The memory control apparatus according to claim 1, wherein the memory command controller asserts the ODT enable signal in advance with respect to a timing of the data transmission so as to compensate for the delay of the delay circuit.

* * * * *